US008310210B2

(12) United States Patent
Doumae et al.

(10) Patent No.: US 8,310,210 B2
(45) Date of Patent: Nov. 13, 2012

(54) EARTH LEAKAGE DETECTION CIRCUIT

(75) Inventors: Hiroshi Doumae, Osaka (JP); Sumio Kagimura, Osaka (JP); Tooru Masuda, Osaka (JP)

(73) Assignee: Daikin Industries, Ltd., Osaka (JP)

( * ) Notice: Subject to any disclaimer, the term of this patent is extended or adjusted under 35 U.S.C. 154(b) by 271 days.

(21) Appl. No.: 12/738,813

(22) PCT Filed: Sep. 1, 2008

(86) PCT No.: PCT/JP2008/065683
§ 371 (c)(1),
(2), (4) Date: Apr. 19, 2010

(87) PCT Pub. No.: WO2009/057380
PCT Pub. Date: May 7, 2009

(65) Prior Publication Data
US 2010/0213905 A1    Aug. 26, 2010

(30) Foreign Application Priority Data
Oct. 30, 2007   (JP) .................................. 2007-281564

(51) Int. Cl.
*H02J 7/00*     (2006.01)
*G01R 15/18*    (2006.01)

(52) U.S. Cl. ....................................... 320/166; 324/127

(58) Field of Classification Search .................. 320/166; 324/127
See application file for complete search history.

(56) References Cited

U.S. PATENT DOCUMENTS

| 5,223,789 | A  | * | 6/1993  | Katsuyama et al. | 324/127 |
| 5,283,726 | A  | * | 2/1994  | Wilkerson        | 363/41  |
| 5,760,587 | A  | * | 6/1998  | Harvey           | 324/434 |
| 2009/0289618 | A1 | * | 11/2009 | Tajima et al.  | 324/127 |

FOREIGN PATENT DOCUMENTS

| JP | 59-44921 A    | 3/1984 |
| JP | 61-9120 A     | 1/1986 |
| JP | 63-18919 A    | 1/1988 |
| JP | 3-169218 A    | 7/1991 |
| JP | 4-178109 A    | 6/1992 |
| JP | 2000-102158 A | 4/2000 |
| JP | 2003-219552 A | 7/2003 |
| JP | 2006-148990 A | 6/2006 |

* cited by examiner

*Primary Examiner* — M'Baye Diao
(74) *Attorney, Agent, or Firm* — Birch, Stewart, Kolasch & Birch, LLP

(57) ABSTRACT

A zero-phase current is outputted by detecting a ground-fault current with a zero-phase-sequence current transformer. A circuit having an open collector output operates when the voltage of the zero-phase current exceeds a positive side threshold value or it falls below a negative side threshold value to discharge a capacitor. When the inter-plate voltage of the capacitor falls below a threshold value voltage, a controlling means detects electric leakage to transmit that to a control unit of an air conditioner.

3 Claims, 10 Drawing Sheets

F I G . 1
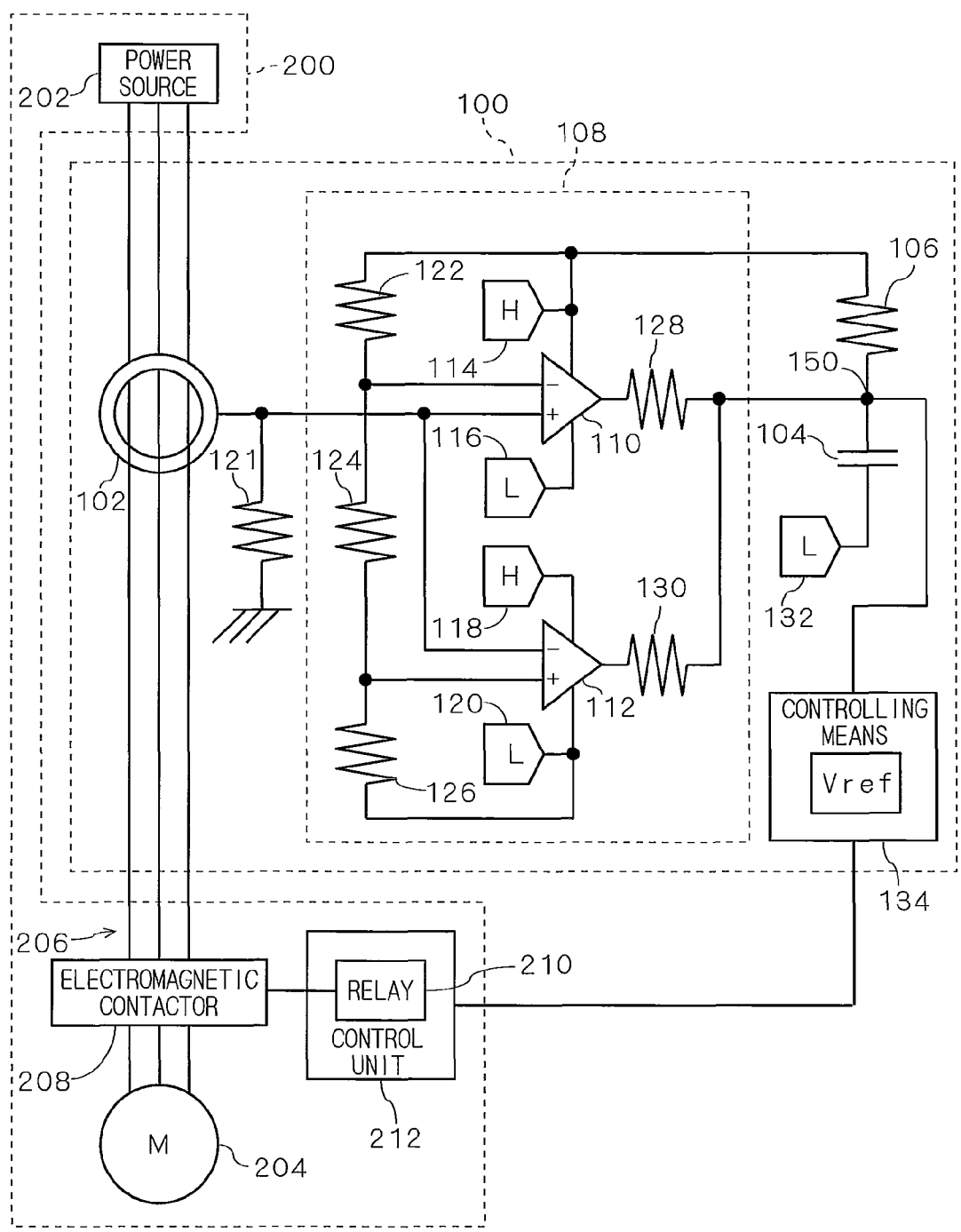

F I G . 5
(a)
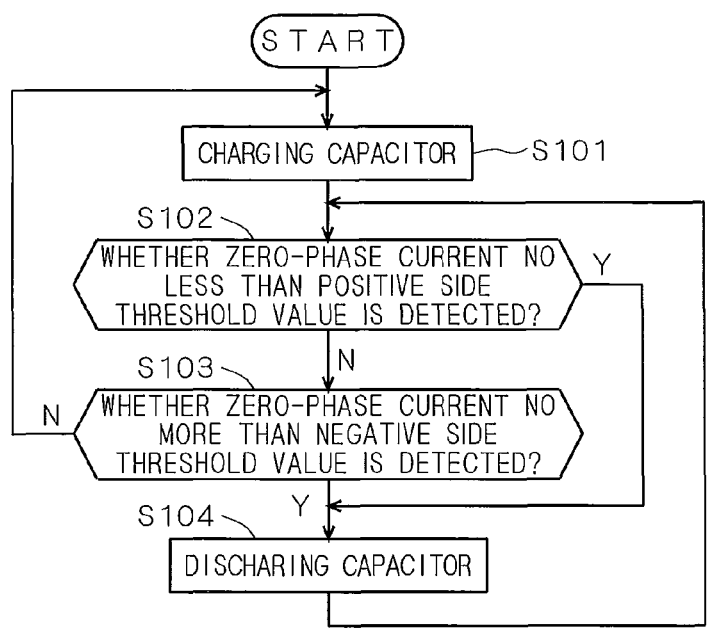
(b)
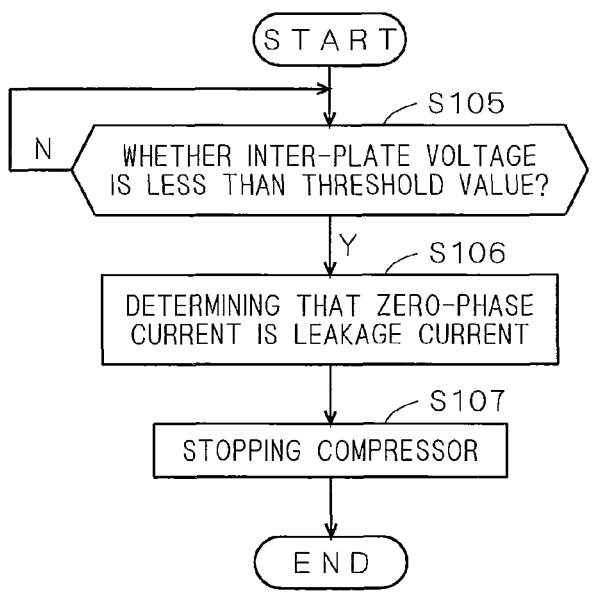

F I G . 1 0
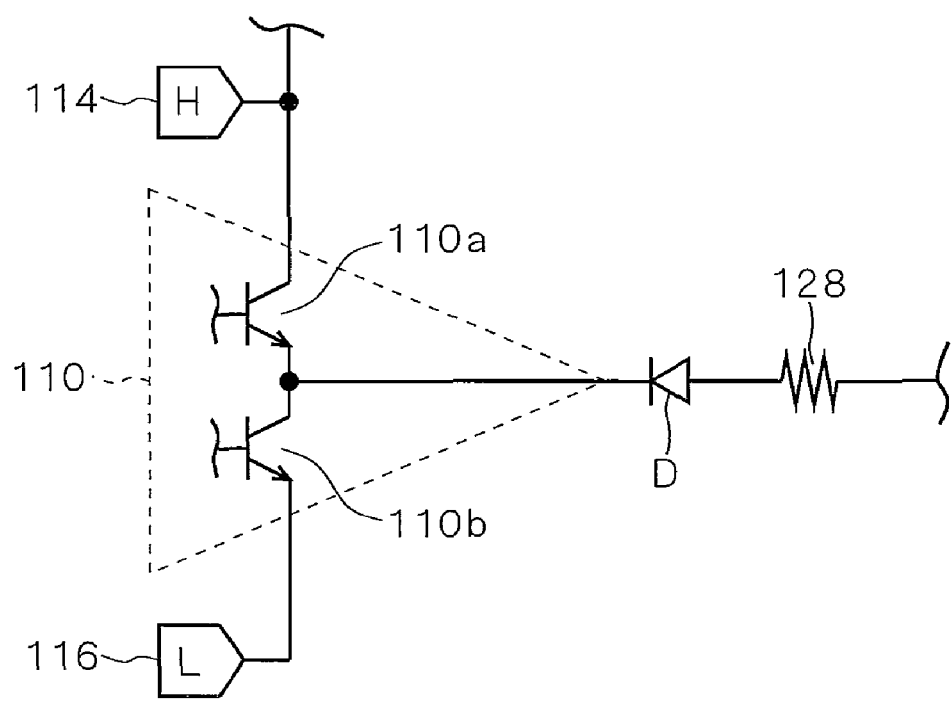

EARTH LEAKAGE DETECTION CIRCUIT

TECHNICAL FIELD

The present invention relates to an electric leakage detection function.

BACKGROUND ART

Conventionally, a technology of an electric leakage detection function detecting presence or absence of electric leakage by detecting a current exceeding a predetermined positive side threshold value and a current falling below a predetermined negative threshold value several times has been proposed, and is disclosed in Japanese Patent Application Laid-Open No. 2003-219552, for example.

DISCLOSURE OF INVENTION

Problems to be Solved by the Invention

These and other objects, features, aspects and advantages of the present invention will become more apparent from the following detailed description of the present invention when taken in conjunction with the accompanying drawings.

However, in the technology disclosed in the above Japanese Patent Application Laid-Open No. 2003-219552, since the electric leakage is not detected unless detecting both of the current exceeding the positive side threshold value and the current falling below the negative side threshold value several times, there has been a problem that immediate response has been not taken. For instance, when rectifier such as a thyristor converts an alternating current to a direct current, a negative current does not flow so that there has been a problem that the electric leakage is not detected even if a positive current exceeds the positive side threshold value (see FIG. 9 illustrating problems of the present invention).

Still more, when an integrated circuit having the electric leakage detection function is used, noise is caused by an operation of the integrated circuit so that a problem is produced such that a measure against noise should be provided in addition to the electric leakage detection function.

Furthermore, the demand for a technology capable of retrofitting the electric leakage detection function to the existing devices has been increased.

In view of the above problems, an object of the present invention is to provide a technology responding promptly without employing an integrated circuit when abnormal ground-fault current is generated.

Means for Solving the Problems

In order to solve the above problems, according to a first aspect of the present invention, an electric leakage detection circuit (100, 100A) includes: a zero-phase-sequence current transformer (102) outputting a zero-phase current by detecting a ground-fault current; a capacitor (104); and a circuit (108) operating when the zero-phase current exceeds a predetermined positive side threshold value or when the zero-phase current falls below a predetermined negative side threshold value, and controlling charge and discharge of the capacitor on the basis of the operation.

According to a second aspect of the present invention, in the first aspect of the invention, the electric leakage detection circuit (100, 100A) further includes: high potential points (114, 118); and a first resistor (106) provided between the high potential points and the capacitor, wherein the circuit (108) employs an open collector output and an output terminal of the circuit is connected to a contact (150) provided between the first resistor and the capacitor (104), and one end of the capacitor (104) is connected to the contact, and the capacitor is charged and discharged on the basis of output of the circuit.

According to a third aspect of the present invention, in the second aspect of the invention, the circuit (108) includes an amplifier having an open collector output operating when the zero-phase current exceeds a predetermined positive side threshold value or when the zero-phase current falls below a predetermined negative side threshold value or wired OR circuits (110, 112) in which an amplifier having a push-pull output is applied; and second resistors (128, 130) connected between an output of the amplifier and the contact (150).

According to a fourth aspect of the present invention, in the third aspect of the invention, the other end of the capacitor (104) is connected to a low potential point (132), and a filter circuit (142) is connected between the contact (150) and the low potential point in parallel to the capacitor.

EFFECTS OF THE INVENTION

According to the first aspect of the present invention, whether the ground-fault current is detected or not is determined by measuring voltage of the capacitor, so that there is no need to provide a measure against noise and the electric leakage detection having a simple configuration to be retrofitted is accomplished.

According to the second aspect of the present invention, the capacitor is discharged, avoiding conflict of voltage by the resistor.

According to the third aspect of the present invention, the electric leakage is promptly detected by appropriately setting each of resistance values of the first resistor and the second resistor, even when only either one of the zero-phase current exceeding the positive side threshold value and the zero-phase current falling below the negative side threshold value is detected.

According to the fourth aspect of the present invention, the capacitor is smoothly discharged so that malfunction is avoided or suppressed.

BRIEF DESCRIPTION OF DRAWINGS

FIG. 1 is a view showing an electric leakage detection circuit according to a first preferred embodiment of the present invention;

FIG. 5 is a flow chart showing a recognition method of the electric leakage detection;

FIG. 10 is a view showing a variation of the preferred embodiments of the present invention.

BEST MODE FOR CARRYING OUT THE INVENTION

Figure 2:
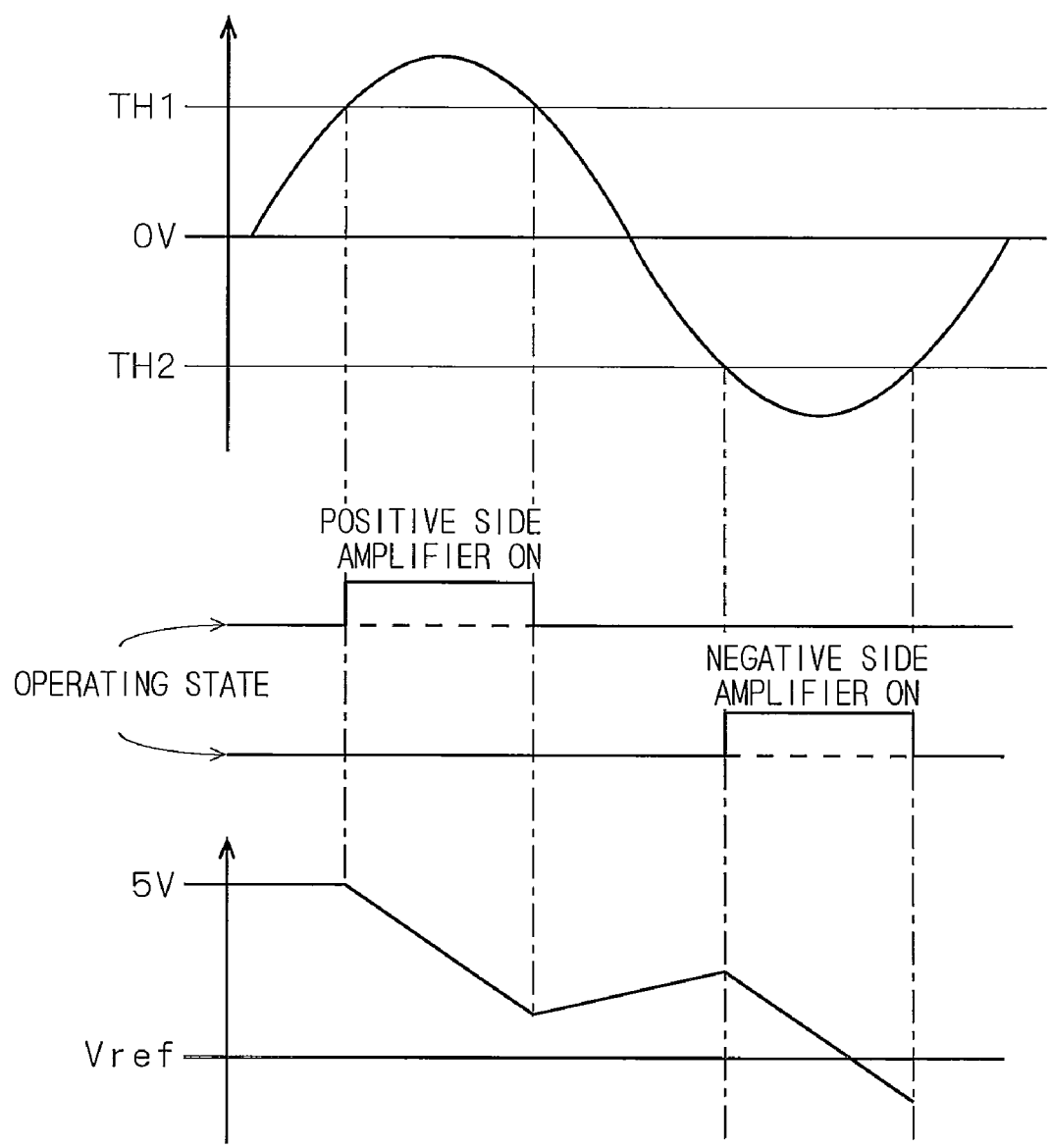
FIG. 2 is a view illustrating an electric leakage detection function.

Hereinafter, preferred embodiments of the present invention will be described referring to the drawings. The following Figures beginning with FIG. 1 show components only relating to the present invention.

<1. First Preferred Embodiment>
<1.1 Outline Configuration>

FIG. 1 is a view showing an electric leakage detection circuit according to a first preferred embodiment of the present invention. The electric leakage detection circuit 100 is provided to an air conditioner 200 comprising a control unit 212, for example, including a power source 202, a motor (electric power load) 204, an electric circuit 206 transmitting power current to the motor 204, an electromagnetic contactor 208 switching conduction/non-conduction of the electric circuit 206, and a relay 210 operating the electromagnetic contactor 208.

<1.2 Circuit Configuration>

The electric leakage detection circuit 100 includes a zero-phase-sequence current transformer 102 detecting a ground-fault current in the electric circuit 206 and outputting the zero-phase current, a capacitor 104, a circuit 108 operating when the zero-phase current exceeds a predetermined positive side threshold value or the zero-phase current falls below a predetermined negative side threshold value and controlling charge and discharge of the capacitor 104 on the basis of the operation. The circuit 108 will be described later. The electric leakage detection circuit 100 includes high potential points 114, 118 and a first resistor (hereinafter, simply referred to as a "resistor") 106 provided between the high potential point 114 and the capacitor 104 (specifically, between the high potential point 114 and a contact 150).

One end of the capacitor 104 is connected to the contact 150, and the capacitor 104 is charged and discharged on the basis of output of the circuit 108. Specifically, the capacitor 104 is discharged when the zero-phase current exceeds the predetermined positive side threshold value or when the zero-phase current falls below the predetermined negative side threshold value, and charged at the time of the rest.

FIG. 2 is a view illustrating the electric leakage detection function. The circuit 108 employs an open collector output and an output terminal of the circuit 108 is connected to the contact 150 provided between the resistor 106 and the capacitor 104. Specifically, the circuit 108 is connected such that a positive side amplifier 110 operating when voltage of the zero-phase current exceeds a predetermined positive side threshold value TH1 and a negative side amplifier 112 operating when the voltage of the zero-phase current falls below a predetermined negative side threshold value TH2 (<TH1) are to be open collector outputs. The circuit 108 includes second resistors (hereinafter, simply referred to as a "resistor") 128, 130 connected between each output of the positive side amplifier 110 and the negative side amplifier 112 and the contact 150.

The circuit 108 includes the high potential point 114 and a low potential point 116 as a power source of the positive side amplifier 110, the high potential point 118 and a low potential point 120 as a power source of the negative side amplifier 112, and resistors 122, 124, and 126 in addition to the positive side amplifier 110, the negative side amplifier 112, and the resistors 128 and 130.

The zero-phase-sequence current transformer 102 having detected the ground-fault current in the electric circuit 206 transmits the zero-phase current to each of a noninverting input terminal of the positive side amplifier 110 and an inverting input terminal of the negative side amplifier 112. More specifically, the zero-phase current is applied to the resistor 121, and a potential determined by a voltage drop in the resistor 121 (hereinafter, provisionally referred to as a "detected potential") is sent out to the inverting input terminal of the positive side amplifier 110 and the noninverting input terminal of the negative side amplifier 112. The high potential point 114 and the low potential point 120 are connected to the inverting input terminal of the positive side amplifier 110 and the noninverting input terminal of the negative side amplifier 112 through the resistors 122, 124, and 126, and the threshold values TH1 and TH2 are inputted, respectively. The comparison of the detected potential and the voltage threshold value is understood, in other words, as the comparison of the zero-phase current and the threshold value of the current corresponding to the voltage threshold value.

The electric leakage detection circuit 100 stores a threshold value Vref for determining whether the ground-fault current detected by the zero-phase-sequence current transformer 102 is the leakage current or not, in a controlling means 134.

The capacitor 104 is charged when the zero-phase current is not outputted and when the detected potential is between the positive side threshold value TH1 and the negative side threshold value TH2 even if the zero-phase current is outputted.

For instance, the following are operated when the zero-phase-sequence current transformer 102 detects the ground-fault current to output the zero-phase current and the detected current drawing a sine wave as shown in FIG. 2 is generated. That is, the positive side amplifier 110 operates and the capacitor 104 is discharged when the voltage of the sine wave exceeds the positive side threshold value TH1. The negative side amplifier 112 operates and the capacitor 104 is discharged when the voltage of the sine wave falls below the negative side threshold value TH2. When an inter-plate voltage of the capacitor 104 falls below the threshold value Vref, the controlling means 134 determines that the leakage current is generated, and transmits that to the control unit 212 of the air conditioner 200.

As described above, since the zero-phase-sequence current transformer 102 is attached to the electric circuit 206 and the controlling means 134 is connected to the control unit 212, the electric leakage detection circuit 100 is retrofitted to the existing air conditioner 200.

<1.3 Setting of Resistance Value and Electric Capacitance>

In the above configuration, the electric leakage detection circuit 100 detects the electric leakage when the voltage of the sine wave shown in FIG. 2 exceeds the positive side threshold value TH1, for example, by appropriately setting an electric capacitance Cl of the capacitor 104, a resistance value R1 of the resistor 106, and resistance values R2, R3 of the resistors 128, 130, when the leakage current is large. The electric capacitance Cl contributes to the threshold value Vref, and the resistance value R1 contributes to the charge speed of the capacitor 104. The resistance values R2, R3 contribute to the discharge speed of the capacitor 104. For example, in the air conditioner 200, the electric leakage is promptly detected by setting Cl to be nearly equal to several tens of μF (e.g., 33 μF), R1 to be nearly equal to several kΩ (e.g., 4.7 kΩ), and R2 to be equal to R3 to be nearly equal to several kΩ (e.g., 1 kΩ). The resistance values of the resistors 122, 124, and 126 are set to be 2Ω, 1Ω, and 2Ω, respectively.

Figure 3:
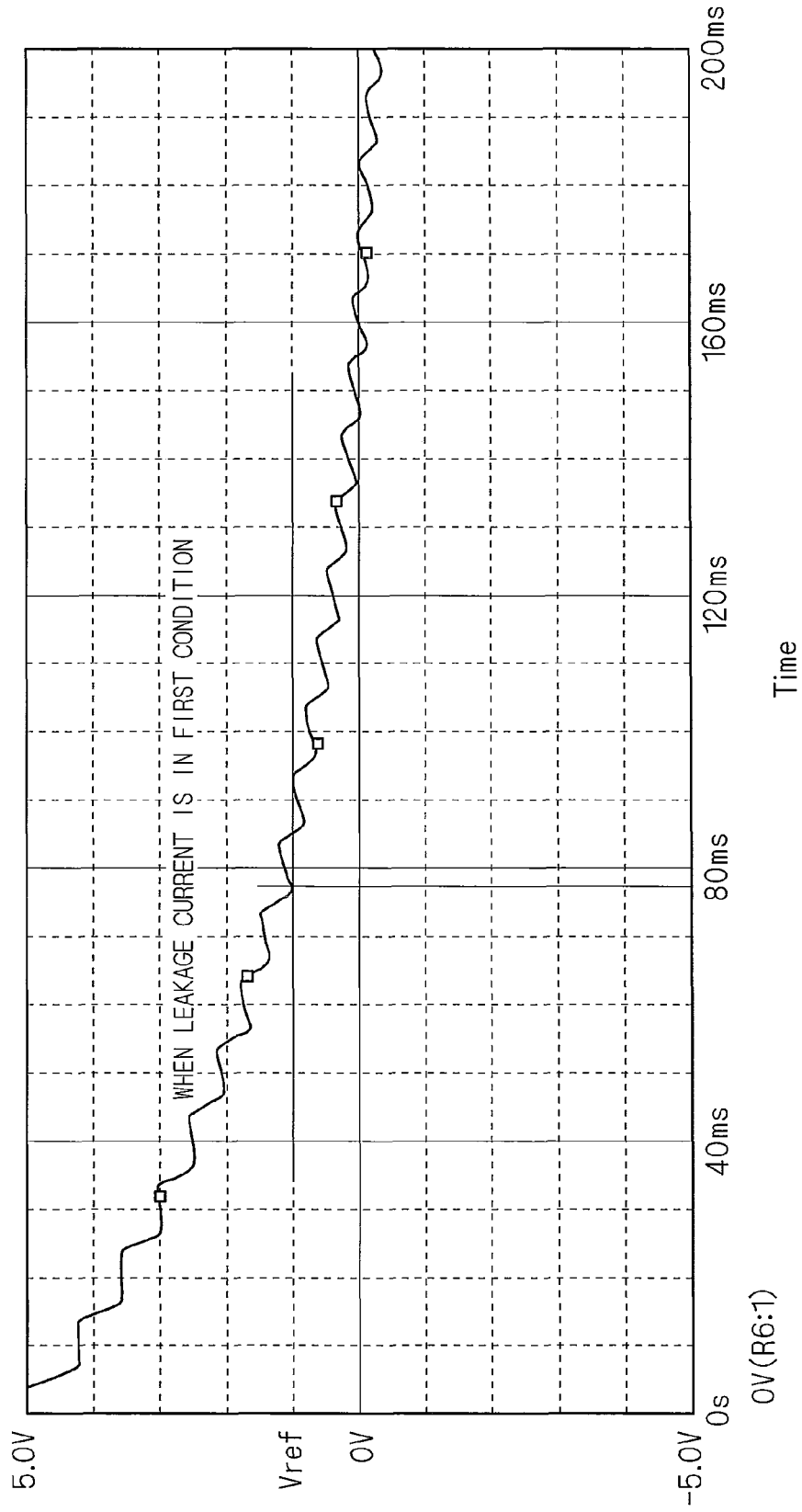
FIG. 3 is a graph showing voltage of a capacitor when a leakage current is 1.
Figure 4:
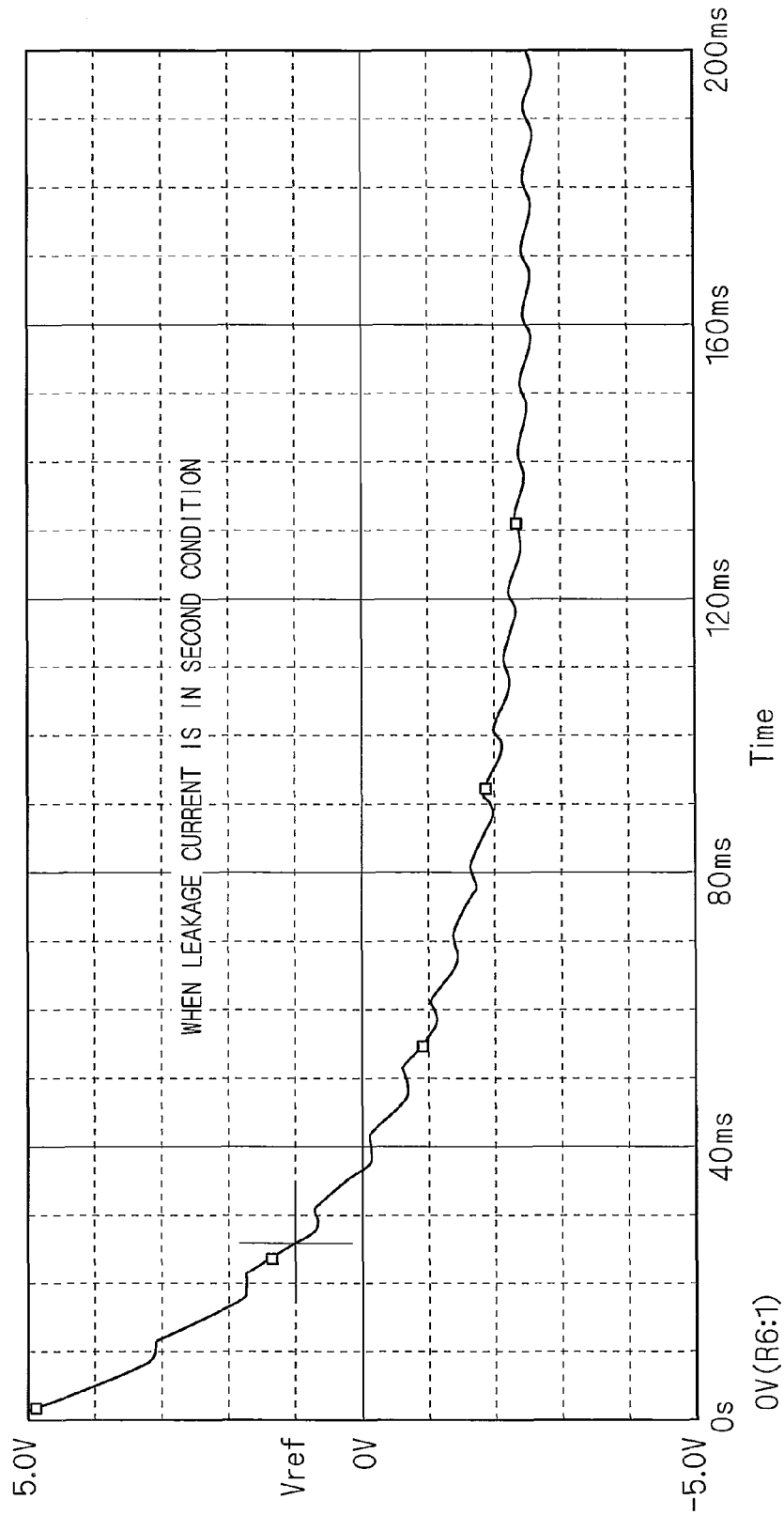
FIG. 4 is a graph showing voltage of the capacitor when the leakage current is 2.

FIG. 3 is a graph showing the voltage of the capacitor 104 when the leakage current is in the first condition, and FIG. 4 is a graph showing the voltage of the capacitor 104 when the leakage current is in the second condition. Here, that "the leakage current is in the first condition" means the leakage current when the detected potential based on the zero-phase current slightly exceeds the positive side threshold value TH1 or when the detected potential slightly falls below the negative side threshold value TH2, and that "the leakage current is in the second condition" means the leakage current when the detected potential greatly exceeds the positive side threshold value TH1 or when the detected potential greatly falls below the negative side threshold value TH2.

While it takes 75 ms until the controlling means 134 detects the electric leakage when the leakage current is in the first condition by setting the electric capacitance C1, the resistance values R1, R2, and R3 to be as described above, it takes 25 ms until the electric leakage is detected when the leakage current is in the second condition. In the present preferred embodiment, frequency of the leakage current is set to be 50 Hz, and the threshold value Vref is set to be 1.0 V. These values are appropriately set in view of characteristics and the like of the attached devices when the electric leakage detection circuit 100 is attached. The sensitivity of the detected potential is adjusted by adjusting the resistance value of the resistor 121.

When the alternating current is converted into the direct current with, for example, a rectifier such as a thyristor and the like by such a configuration, that is, even when the current in a negative direction does not flow, the leakage current is detected when it is large.

<1.4 Operation>

FIG. 5 is a flow chart illustrating the operation of the electric leakage detection circuit. The electric leakage detection circuit 100 operates as follows by having the above configuration. The present flow chart shows only the operations relating to the electric leakage detection, and the illustrations and descriptions of other processing operations are omitted.

The capacitor 104 is charged via the resistor 106 (step S101), and waits until the circuit 108 has detected the zero-phase current corresponding to the detected potential of no less than the positive side threshold value TH1 or until the circuit 108 detects the zero-phase current corresponding to the detected potential of no more than the negative side threshold TH2 (steps S102 and S103: FIG. 5 is represented as the comparison of the zero-phase current and the threshold values for simplicity.). In the steps S102 and S103, yes is selected when the circuit 108 has detected the zero-phase current corresponding to the detected potential of no less than the positive side threshold value TH1 or when the circuit 108 has detected the zero-phase current corresponding to the detected potential of no more than the negative side threshold value TH2, and then the capacitor 104 is discharged (step S104). Specifically, the resistor 128 and an open collector of the positive side amplifier 110 become discharging paths of the capacitor 104, when the detected potential is no less than the positive side threshold value TH1, or the resistor 130 and an open collector of the negative side amplifier 112 become the discharging paths of the capacitor 104 when the detected potential is no more than the negative side threshold value TH2, respectively.

Despite whether performing the step S104 or not, the capacitor 104 is connected to the high potential point 114 via the resistor 106. However, the above-described discharging paths have impedance lower than that of the capacitor 104 so that the capacitor 104 is discharged without being charged. At this time, since the resistor 106 is present, the high potential point 114 does not become shorted with the low potential points 116, 120 via the aforementioned discharging paths. In other words, the conflict between the high potential and the low potential in the aforementioned discharging paths is prevented by the resistor 106 and at the same time, the discharge of the capacitor 104 is conducted.

When the capacitor 104 is discharged, the process returns to the step S102, and the circuit 108 determines whether the detected potential still exceeds the threshold value in the steps S102 and S103.

Along with the charge and discharge of the capacitor 104, the controlling means 134 observes whether the inter-plate voltage of the capacitor 104 is less than the threshold value Vref or not (step S105), and if the inter-plate voltage is no less than the threshold value Vref and the zero-phase current is not detected, no is selected to repeat the step S105. On the other hand, when the inter-plate voltage is less than the threshold value Vref, the controlling means 134 determines that the zero-phase current is the electric leakage (step S106), and transmits that to the control unit 212. The control unit 212 having received that the electric leakage was generated controls the relay 210 to switch the electromagnetic contactor 208 to a non-conducting state and stop a compressor 204 (step S107).

<1.5 Effect of First Preferred Embodiment>

As described above, the electric leakage detection circuit 100 operates when the detected potential determined on the basis of the zero-phase current exceeds the positive side threshold value TH1 or when it falls below the negative side threshold value TH2, and includes the circuit 108 controlling the charge and the discharge of the capacitor 104 on the basis of the operation. Accordingly, whether the ground-fault current is detected or not is determined by measuring the voltage of the capacitor 104, so that there is no need to provide a measure against noise and the electric leakage is detected with a simple configuration to be retrofitted.

The circuit 108 employs the open collector output, and the output terminal thereof is connected between the capacitor 104 and the resistor 106, thereby avoiding the conflict of the voltage by the resistor 106 and discharging the capacitor 104.

Further, the electric leakage is promptly detected by appropriately setting the resistance values R2 and R3 of the resistors 128 and 130, and the resistance value R1 of the resistor 106 even when only either one of the detected potential exceeding the positive side threshold value TH1 and the detected potential falling below the negative side threshold value TH2.

2. Second Preferred Embodiment

While a mode providing only the capacitor 104 to the output terminal of the circuit 108 has been described in the aforementioned preferred embodiment, the present invention is not limited to this. Here, as a second preferred embodiment of the present invention, a mode providing the capacitor 104 and a filter circuit to the output terminal of the circuit 108 will be described referring to the drawings. Unless otherwise stated, components having the identical functions to the aforementioned preferred embodiment will be denoted by the same reference numerals, which will be not described in detail.

2.1 Outline Configuration

Figure 6:
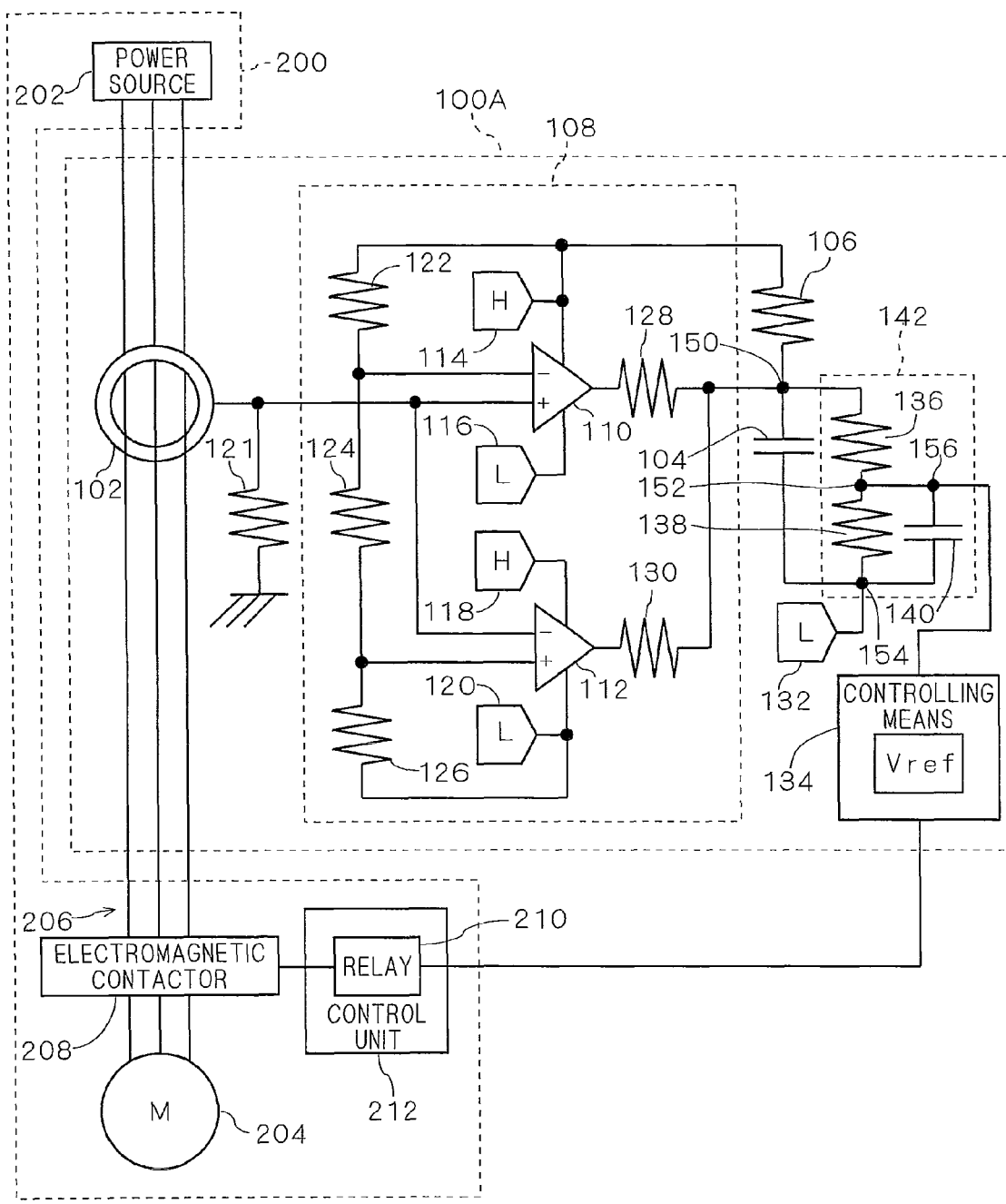
FIG. 6 is a view showing an electric leakage detection circuit according to a second preferred embodiment of the present invention.

FIG. 6 is a view showing an electric leakage detection circuit 100A according to a second preferred embodiment. The electric leakage detection circuit 100A is provided in the air conditioner 200 similarly to the aforementioned preferred embodiment.

2.2 Circuit Configuration

The electric leakage detection circuit 100A is configured such that a filter circuit 142 is added to the electric leakage detection circuit 100 according to the aforementioned preferred embodiment. Specifically, as shown in FIG. 6, the other end of the capacitor 104 (an end not connected to the resistor 106) is connected to the low potential point 132, and the filter circuit 142 is connected in parallel to the capacitor 104 between the contact 150 and the low potential point 132.

The filter circuit 142 includes resistors 136, 138, and a capacitor 140. The resistor 136 is connected between the contact 150 and a contact 152, and the resistor 138 is connected between the contact 152 and a contact 154. The capacitor 140 is connected to the contact 152 via a contact 156, and the other end of the capacitor 140 is connected to the contact 154. The capacitor 104 connected to the contact 150 is connected to the low potential point 132 via the contact 154. The controlling means 134 is connected to the contact 156.

Figure 7:
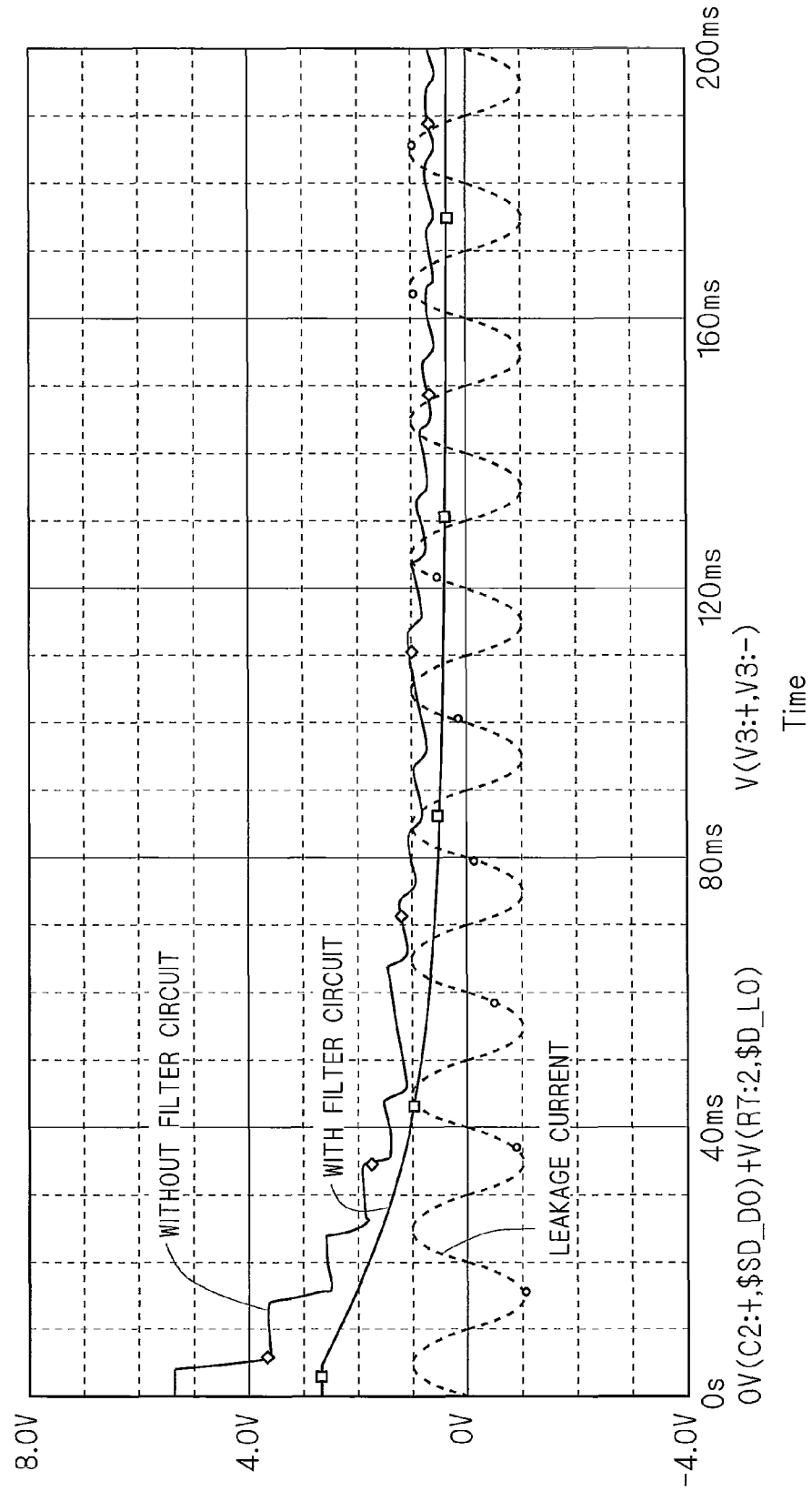
FIG. 7 is a graph showing voltage of the capacitor when the leakage current is 1.

FIG. 7 is a graph showing the voltage of the capacitor 104 when the leakage current is 1. As shown in FIG. 7, the voltage of the capacitor 104 is smoothly dropped (discharge) by providing the filter circuit 142, thereby suppressing malfunction.

2.3 Setting of Resistance Value and Electric Capacitance

In the configuration described above, malfunction is suppressed and the electric leakage is promptly detected when it is large by appropriately setting the electric capacitance C1 of the capacitor 104, the resistance value R1 of the resistor 106, the resistance values R2, R3 of the resistors 128, 130, the resistance values R4, R5 of the resistors 136, 138 of the filter circuit 142, and the electric capacitance C2 of the capacitor 140. For example, in the air conditioner 200, the electric leakage is promptly detected by setting C1 to be nearly equal to several µF (e.g., 4.7 µF), R1 to be nearly equal to several tens of kΩ (e.g., 82 kΩ), R2 to be equal to R3 to be nearly equal to several kΩ (e.g., 1 kΩ), R4 to be equal to R5 to be nearly equal to several tens of kΩ (e.g., 47 kΩ), and C2 to be nearly equal to several hundreds of nF (e.g., 0.47 µF). The resistance values of the resistors 122, 124, and 126 are set to be 2Ω, 1Ω, and 2Ω, respectively.

Figure 8:
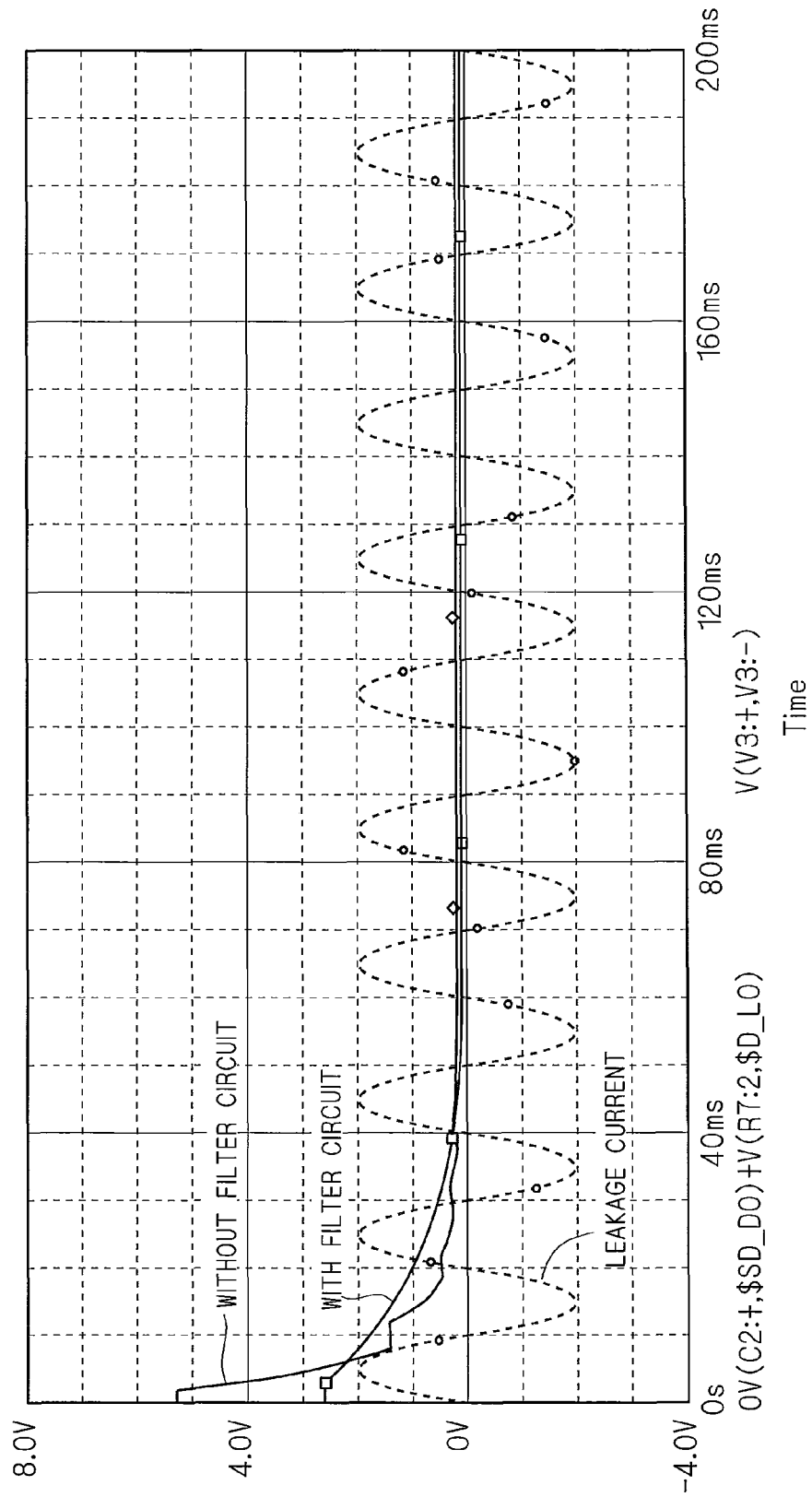
FIG. 8 is a graph showing voltage of the capacitor when the leakage current is 2.
Figure 9:
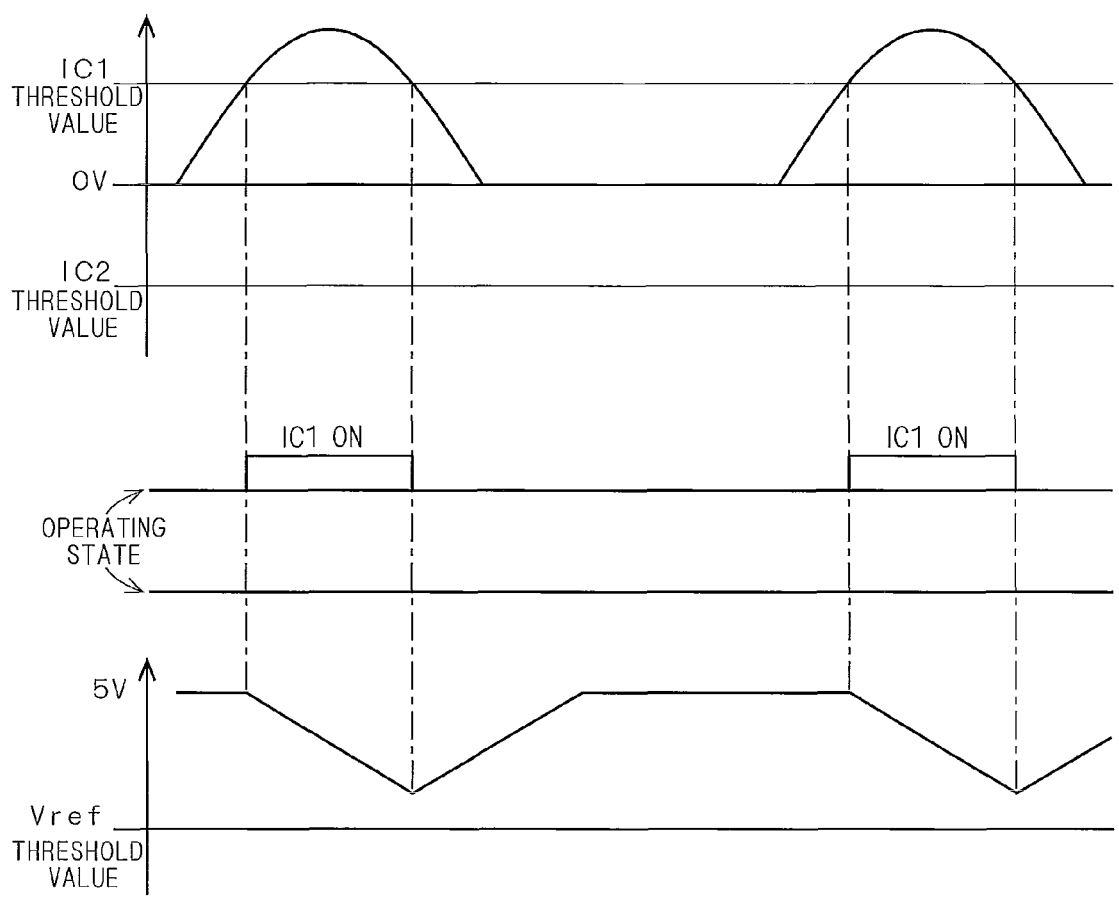
FIG. 9 is a view illustrating the problems of the present invention.

FIG. 8 is a graph showing the voltage of the capacitor 104 when the leakage current is 2. The electric leakage detection circuit 100A includes the filter circuit 142 and the electric capacitances C1, C2, and the resistance values R1 to R6 are set as described above, thereby producing the advantages as follows. For instance, when harmonics of approximately 5 ms is erroneously detected due to noise and the like, the voltage of the capacitor 104 is immediately dropped to approximately 2.5 V to cause malfunction when the filter circuit 142 is not provided. However, by providing the filter circuit 142 to the electric leakage detection circuit 100A, harmonics erroneously detected are removed to suppress the malfunction of the electric leakage detection circuit 100A.

2.4 Operation

The operation of the present preferred embodiment will not be described in detail since it is substantially identical to the aforementioned preferred embodiment.

2.5 Effect of Second Preferred Embodiment

As described above, the filter circuit 142 is connected in parallel to the capacitor 104 between the contact 150 and the low potential point 132 so that the capacitor 104 is smoothly discharged, avoiding or suppressing the malfunction.

While the amplifiers with the open collector output are employed as the positive side amplifier 110 and the negative side amplifier 112 in the above-described preferred embodiment, a wired OR circuit in which the amplifier with the push-pull output is applied may be employed as a variation of the preferred embodiment.

FIG. 10 is a view showing the above variation with the positive side amplifier 110 as an example. Two npn-type transistors 110a and 110b connected in series are disposed between the high potential point 114 and the low potential point 116 at an output stage of the positive side amplifier 110. That is, a collector of the transistor 110a is connected to the high potential point 114, an emitter thereof is connected to a collector of the transistor 110b, and an emitter of the transistor 110b is connected to the low potential point 116. The contact point of the emitter of the transistor 110a and the collector of the transistor 110b serves as the output terminal of the positive side amplifier 110. A diode D is interposed between the output terminal of the positive side amplifier 110 and the resistor 128, and a cathode thereof is connected to the output terminal of the positive side amplifier 110 and an anode thereof is connected to the resistor 128, respectively.

In this manner, the positive side amplifier 110 discharges the capacitor 104 without charging by providing the diode D to allow a current to flow into the output stage of the positive side amplifier 110 and to prevent the current from flowing out even though the positive side amplifier 110 has the configuration of the push-pull output.

While the example of the positive side amplifier 110 has been described above, the negative side amplifier 112 may have the similar configuration.

While the invention has been shown and described in detail, the foregoing description is in all aspects illustrative and not restrictive. It is therefore understood that numerous modifications and variations can be devised without departing from the scope of the invention.

The invention claimed is:

1. An electric leakage detection circuit comprising:
   a zero-phase-sequence current transformer outputting a zero-phase current by detecting a ground-fault current;
   a capacitor;
   a circuit configured to operate an operation when said zero-phase current exceeds a predetermined positive side threshold value or when said zero-phase current falls below a predetermined negative side threshold value, and to control charge and discharge of said capacitor on the basis of said operation;
   high potential points; and
   a first resistor provided between said high potential points and said capacitor, wherein
   said circuit employs an open collector output,
   an output terminal of said circuit is connected to a contact provided between said first resistor and said capacitor, one end of said capacitor is connected to said contact, and
   said capacitor is charged and discharged on the basis of output of said circuit.

2. The electric leakage detection circuit according to claim 1, wherein
   said circuit includes an amplifier having an open collector output or wired OR circuits in which an amplifier having a push-pull output is applied, said open collector output being configured to operate an operation when said zero-phase current exceeds a predetermined positive side threshold value or when said zero-phase current falls below a predetermined negative side threshold value; and
   second resistor connected between an output of said amplifier and said contact.

3. The electric leakage detection circuit according to claim 2, wherein
   another end of said capacitor is connected to a low potential point, and
   a filter circuit is connected between said contact and said low potential point in parallel to said capacitor.

* * * * *